United States Patent
Cox et al.

(10) Patent No.: US 10,296,059 B2
(45) Date of Patent: May 21, 2019

(54) TOOL-LESS AND REUSABLE HEAT SPREADER

(71) Applicant: INTERNATIONAL BUSINESS MACHINES CORPORATION, Armonk, NY (US)

(72) Inventors: Aaron R. Cox, Tucson, AZ (US); ZhenDe Fu, Shanghai (CN); Lei R. Li, Shanghai (CN); Jason E. Minyard, Phoenix, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 292 days.

(21) Appl. No.: 14/853,708

(22) Filed: Sep. 14, 2015

(65) Prior Publication Data
US 2017/0075393 A1    Mar. 16, 2017

(51) Int. Cl.
*G06F 1/20*    (2006.01)
*B23P 15/26*    (2006.01)

(52) U.S. Cl.
CPC ............. *G06F 1/20* (2013.01); *B23P 15/26* (2013.01)

(58) Field of Classification Search
CPC .... D06F 55/02; F16B 2/10; H01L 2023/4087; H01L 23/4093; F28F 1/20; G06F 1/20; B23P 15/26
See application file for complete search history.

(56) References Cited

U.S. PATENT DOCUMENTS

| 4,609,040 A | * | 9/1986 | Moore | H01L 23/4093 165/80.3 |
| 4,959,892 A | * | 10/1990 | Wang | A44B 99/00 24/489 |
| 5,886,872 A | | 3/1999 | Koenen et al. | |
| 6,025,992 A | | 2/2000 | Dodge et al. | |
| 6,053,240 A | * | 4/2000 | Johnston | H01L 23/367 165/185 |
| 6,249,437 B1 | * | 6/2001 | Ferranti | H01L 23/367 165/80.3 |
| 6,649,108 B2 | | 11/2003 | McCullough et al. | |

(Continued)

FOREIGN PATENT DOCUMENTS

| CN | 201199520 Y | 2/2009 |
| CN | 103176571 A | 6/2013 |
| JP | 2004079949 A | 3/2004 |

OTHER PUBLICATIONS

Cutt et al., "Clip-On Heat Sink for Memory Single In-Line Memory Module", Feb. 1, 1990, IP.com No. 000099837, IBM Technical Disclosure Bulletin vol. 32 No. 9B, Feb. 1990, IP.com Electronic Publication: Mar. 15, 2005.

*Primary Examiner* — Tho V Duong
(74) *Attorney, Agent, or Firm* — Griffiths & Seaton PLLC

(57) ABSTRACT

A tool-less heat spreader for dissipating heat produced by an electrical computing component includes a first clamp member having a first component interface end and an opposite, first lever end; and a second clamp member having a second component interface end and an opposite, second lever end; where the first clamp member and the second clamp member are biasedly coupled to one another and such movement of at least one of the first lever end and the second lever end at least partially overcomes the bias and moves the first and second component interface ends away from one another.

10 Claims, 4 Drawing Sheets

(56) References Cited

U.S. PATENT DOCUMENTS

| | | |
|---|---|---|
| 7,391,613 B2 | 6/2008 | Lai et al. |
| 7,429,788 B2 | 9/2008 | Clayton et al. |
| 7,612,446 B2 | 11/2009 | Dang et al. |
| 7,626,259 B2 | 12/2009 | Wehrly, Jr. et al. |
| 7,626,823 B2 | 12/2009 | Yang et al. |
| 7,755,897 B2 * | 7/2010 | Chen .................... H01L 23/427 |
| | | 257/709 |
| 7,944,702 B2 | 5/2011 | Ni et al. |
| 8,076,772 B2 | 12/2011 | Hwang et al. |
| 8,081,474 B1 | 12/2011 | Zohni et al. |
| 8,134,834 B2 | 3/2012 | Meyer, IV et al. |
| 8,154,873 B2 | 4/2012 | Lian et al. |
| 8,638,559 B2 | 1/2014 | Barina et al. |
| 8,705,240 B1 | 4/2014 | Zohni et al. |
| 2004/0037044 A1 | 2/2004 | Cook et al. |
| 2004/0250989 A1 * | 12/2004 | Im ...................... H01L 23/4093 |
| | | 165/80.1 |
| 2008/0062652 A1 | 3/2008 | Lieberman et al. |
| 2008/0089034 A1 | 4/2008 | Hoss et al. |
| 2008/0276099 A1 | 11/2008 | Nguyen et al. |
| 2009/0034183 A1 * | 2/2009 | Chen ......................... G06F 1/20 |
| | | 361/679.47 |
| 2009/0103269 A1 | 4/2009 | Liu et al. |
| 2009/0109613 A1 | 4/2009 | Legen et al. |
| 2009/0129026 A1 | 5/2009 | Baek et al. |
| 2009/0257197 A1 * | 10/2009 | Yang ................... H01L 23/4093 |
| | | 361/720 |
| 2013/0186595 A1 | 7/2013 | Hsieh |
| 2014/0235080 A1 | 8/2014 | Cox et al. |

\* cited by examiner

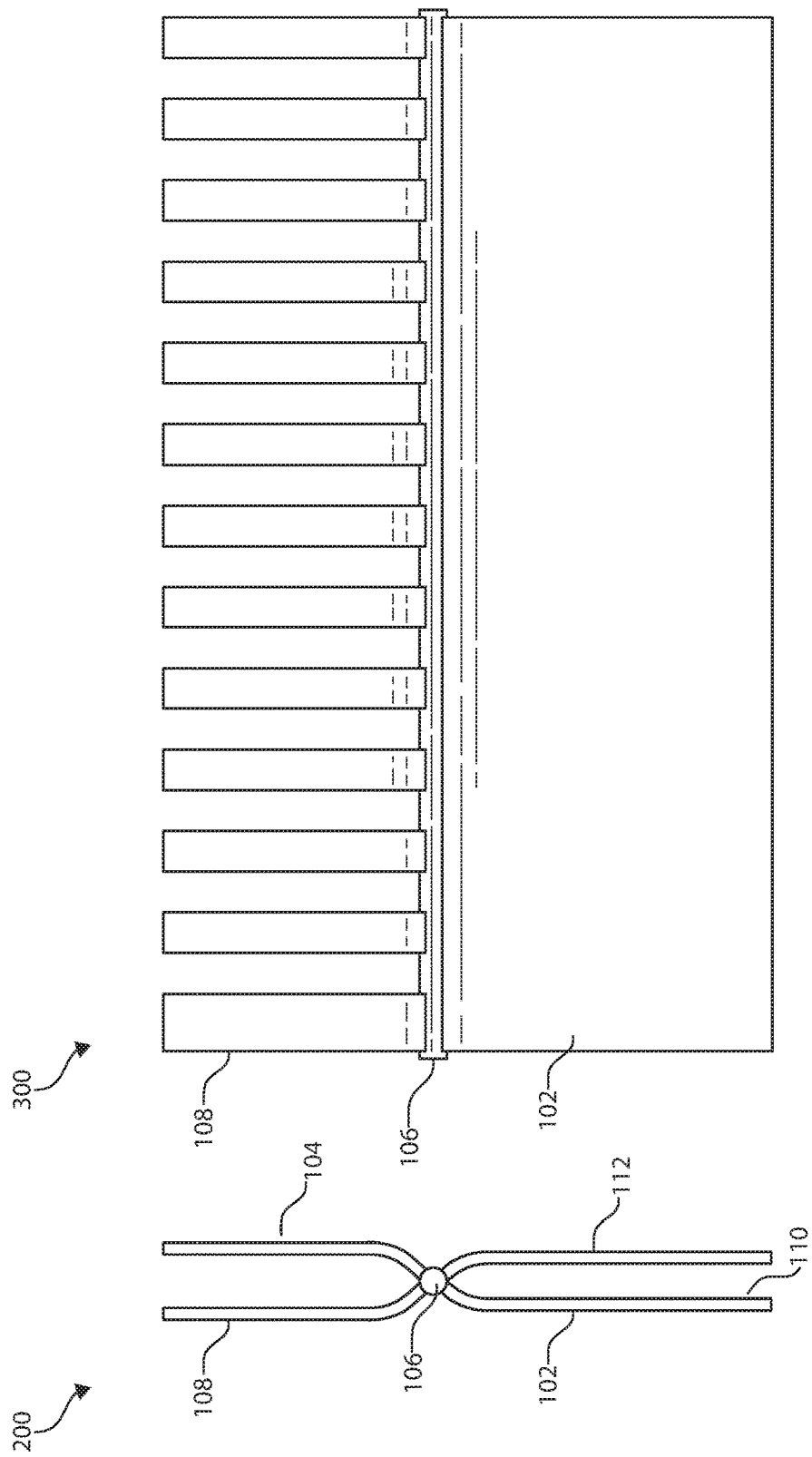

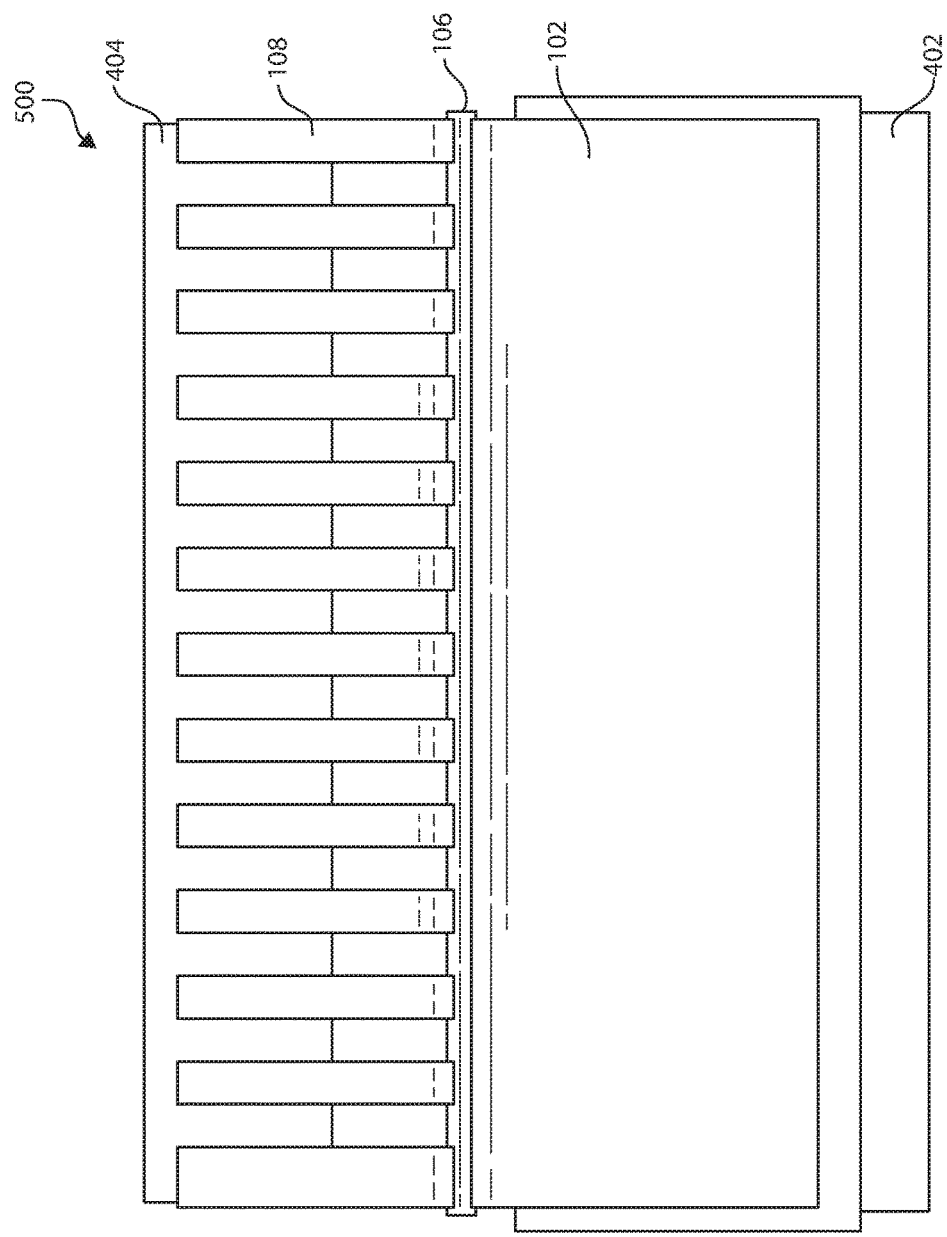
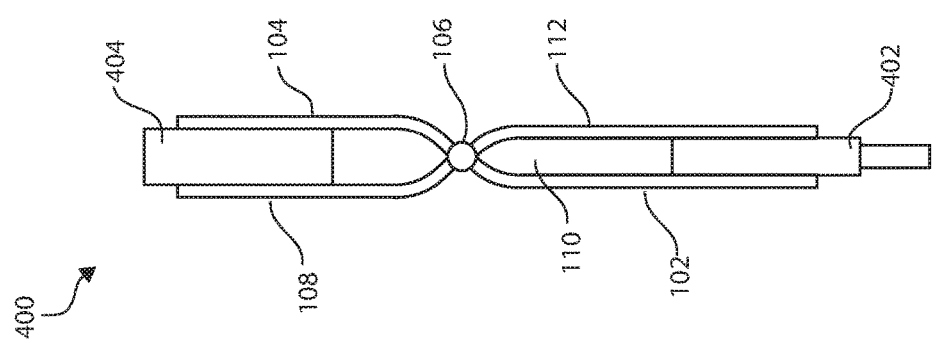

TOOL-LESS AND REUSABLE HEAT SPREADER

BACKGROUND OF THE INVENTION

Field of the Invention

This disclosure relates in general to computing systems, and more particularly, a heat spreader apparatus for the dissipation of heat generated by the components therein.

Description of the Related Art

In today's society, computer systems are commonplace. Computer systems may be found in the workplace, at home, or at school. As integrated circuits (e.g., central processing units (CPUs) in a computer system) become denser and more complex, components inside an integrated circuit chip are drawing more power and thus generating more heat. Various cooling systems have been used to dissipate heat generated by integrated circuit chips such as memory modules, for example within personal computers, mobile computers, or similar electrical devices.

Memory module heat spreaders (heat sinks) are commonly used to increase Dual-Inline Memory Module (DIMM) cooling efficiency. Heat sinks may be purchased as stand-alone kits to be installed by users, or they may come pre-attached to memory modules and purchased as an assembly.

SUMMARY OF THE DESCRIBED EMBODIMENTS

A tool-less heat spreader for dissipating heat produced by an electrical computing component includes a first clamp member having a first component interface end and an opposite, first lever end; and a second clamp member having a second component interface end and an opposite, second lever end; wherein, the first clamp member and the second clamp member are biasedly coupled to one another and such movement of at least one of the first lever end and the second lever end at least partially overcomes the bias and moves the first and second component interface ends away from one another.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings.

Understanding that these drawings depict embodiments of the invention and are not therefore to be considered to be limiting of its scope, the invention will be described and explained with additional specificity and detail through the use of the accompanying drawings, in which:

FIG. 2 illustrates a sectional view of a heat spreader according to aspects of the present invention;

FIG. 3 illustrates a frontal perspective view of a heat spreader, according to aspects of the present invention;

FIG. 4 illustrates a sectional view of a heat spreader according to aspects of the present invention;

FIG. 5 illustrates a perspective view of a heat spreader and memory module according to aspects of the present invention.

DETAILED DESCRIPTION OF THE DRAWINGS

The following detailed description of the invention merely provides exemplary embodiments and is not intended to limit the invention of the application and uses of the invention. Furthermore, there is no intention to be bound by any theory presented in the preceding background of the invention of the following detailed description of the invention.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

As aforementioned, as integrated circuits (e.g., central processing units (CPUs) in a computer system) become denser and more complex, components inside an integrated circuit chip are drawing more power and thus generating more heat. Various cooling systems have been used to dissipate heat generated by integrated circuit chips such as memory modules, for example within personal computers, mobile computers, or similar electrical devices. Memory module heat spreaders (heat sinks) are commonly used to increase Dual-Inline Memory Module (DIMM) cooling efficiency. Heat sinks may be sold as stand alone kits to be installed by users, or they may come pre-attached to memory modules and purchased as an assembly. When purchased as stand alone kits, heat sinks often contain numerous parts and small screws that are cumbersome and require tools to install and remove.

Accordingly, the present invention, in one embodiment, provides a rigid heat shield comprising a butterfly clamping mechanism, formed such that it may be opened and slid over the top of an electronic computing component (e.g. DIMM). A thermal interface material is formed into the lower ends of the clamp (component interface ends) such that clamping pressure engages the thermal interface material into the electronic computing component for improved heat dissipation.

The mechanisms of the present invention provide for a tool-less installation/removal of the heat spreader to a DIMM, and without the need for any small or loose parts which may be easily displaced. The heat spreader taught infra is a user-friendly solution in which simple rotation of an overriding heat shield compresses and fixes the cooling assembly together onto the DIMM. Additionally, the heat spreader taught herein is reusable, allowing for replacement of DIMMs without needing to replace the cooling system affixed thereon.

Figure 1:
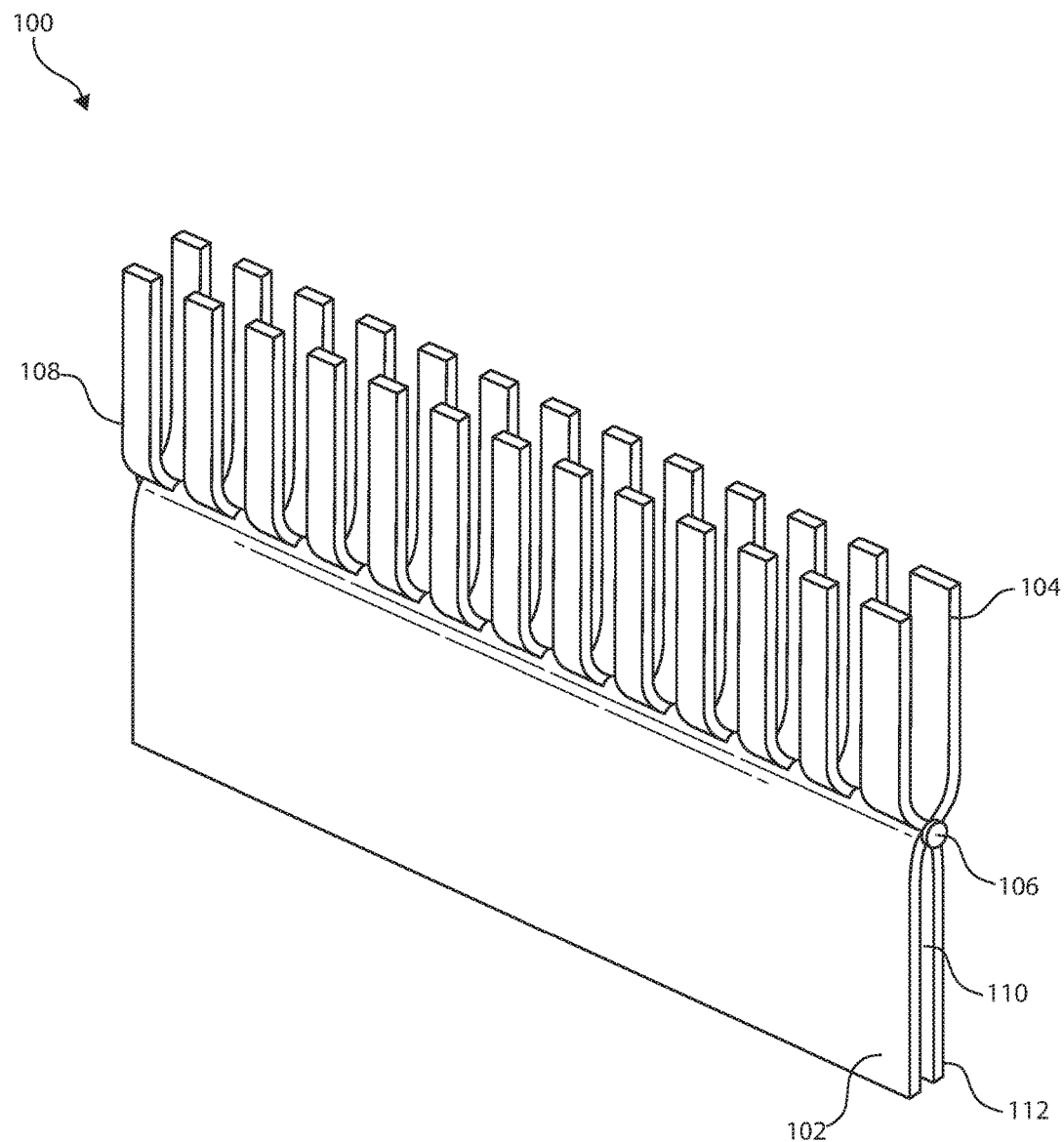
FIG. 1 illustrates a perspective view of a heat spreader according to aspects of the present invention.

Turning now to FIG. 1, a perspective view of a heat spreader assembly 100 according to one embodiment of the present invention. Illustrated is a rigid heat shield comprising a first clamp member having a first component interface end 102, and an opposite, first lever end 104; and a second clamp member having a second component interface end 112, and an opposite, second lever end 108. A thermal interface material 110 is formed into the inside edges of the first component interface end 102 and the second component interface end 112 and engages the first component interface end 102 and the second component interface end 112 against either side of an electronic computing component (e.g. DIMM). The first component interface end 102 and the second component interface end 112 are biased toward each other by a coupling means 106 (e.g. a spring). The first lever end 104 and the second lever end 108 have formed into them a plurality of heat dissipating fins.

The thermal interface material 110 is formed of two parallel surfaces connected to the inside edges of the first component interface end 102 and the second component interface end 112 for placement atop of the electronic computing component (e.g. DIMM). The thermal interface material 110 is formed to be substantially the same width and height as the DIMM, while providing room on either side and bottom of the DIMM for coupling with a DIMM socket. This provides for substantially close thermal engagement between the top surface of the DIMM and the thermal interface material 110. The close thermal engagement helps improve heat transferring efficiency from the surface of the corresponding electronic computing component to the thermal interface material 110, which is thermally conductive. The thermal interface material 110 may be constructed substantially of materials such as paraffin wax, a silicone base, a combination of such, or any other thermally conductive material commonly known in the art.

The rigid heat shield comprising the first clamp member and the second clamp member is formed of two intersecting surfaces connected with coupling means 106. The coupling means 106 biases the first component interface end 102 and the second component interface end 112 toward one another, acting as a fulcrum, and such movement (clamping pressure) of at least one of the first lever end 104 and the second lever end 108 at least partially overcomes the bias and moves the first component interface end 102 and second component interface end 112 away from one another. The first component interface end 102 and the second component interface end 112 are formed to be substantially the same or only slightly larger in width and height than that of the thermal interface material 110 formed inside. The first component interface end 102 and the second component interface end 112 may be substantially the same width and height of the first lever end 104 and the second lever end 108, or the first component interface end 102 and the second component interface end 112 may vary in width and height from the first lever end 104 and the second lever end 108. Here again, coupling means 106 provide for the first component interface end 102 and the second component interface end 112 to be biased toward one another such that when movement (clamping pressure) is released, the thermal interface material 110 is compressed by the first component interface end 102 and the second component interface end 112 to provide thermal engagement to the surface of either side of the DIMM. The rigid heat shield comprising the first clamp member and the second clamp member may be constructed substantially of materials such as aluminum, copper, a combination of such, or any other thermally conductive material commonly known in the art. The thermal interface material 110 and the first and second clamp members thereon may be adjusted for a height and width corresponding to various sizes of electronic computing components.

At an upper surface of the first lever end 104 and the second lever end 108, formed are the plurality of heat fins. The number, width, and height of the heat fins formed into the first lever end 104 and the second lever end 108 may vary according to the specific implementation. The heat fins provide an additional notched surface for which to dissipate heat through increased airflow.

FIG. 2 illustrates a sectional view of a heat spreader assembly 200 according to one embodiment of the present invention. Illustrated is the rigid heat shield comprising the first clamp member having the first component interface end 102, and the opposite, first lever end 104; and the second clamp member having the second component interface end 112, and the opposite, second lever end 108. The thermal interface material 110 is formed into the inside edges of the first component interface end 102 and the second component interface end 112 and engages the first component interface end 102 and the second component interface end 112 against either side of the electronic computing component (e.g. DIMM). The first component interface end 102 and the second component interface end 112 are biased toward each other by coupling means 106 (e.g. a spring). The first lever end 104 and the second lever end 108 have formed into them a plurality of heat dissipating fins.

FIG. 3 illustrates a frontal perspective view of a heat spreader 300, according to aspects of the present invention. Illustrated is a frontal view of the first clamp member having the first component interface end 102, and a frontal view of the second clamp member having a second lever end 108. Coupling means 106 provides a bias for the first component interface end 102 and the second component interface end 112 (not shown) toward each other. Noted in view 300 is the plurality of heat dissipating fins formed into the first lever end 104 (not shown) and the second lever end 108.

FIG. 4 illustrates a sectional view of a heat spreader 400 according to an alternate embodiment of the present invention. Illustrated is the rigid heat shield comprising the first clamp member having the first component interface end 102, and the opposite, first lever end 104; and the second clamp member having the second component interface end 112, and the opposite, second lever end 108. The thermal interface material 110 is formed into the inside edges of the first component interface end 102 and the second component interface end 112 and engages the first component interface end 102 and the second component interface end 112 against either side of an electronic computing component (e.g. DIMM) 402. The first component interface end 102 and the second component interface end 112 are biased toward each other by coupling means 106 (e.g. a spring). The first lever end 104 and the second lever end 108 have formed into them a plurality of heat dissipating fins. In one embodiment, a wedge 404 may be placed between the first lever end 104 and the second lever end 108 to further bias and compress the first component interface end 102 and the second component interface end 112 toward one another, and against either side of the electronic computing component 402 to provide good thermal engagement for improved heat dissipation. The wedge 404 may be formed of any thermally conductive material commonly known in the art or suitable for such an application.

FIG. 5 illustrates a frontal perspective view of a heat spreader 500, according to alternate aspects of the present invention. Illustrated is a frontal view of the first clamp member having the first component interface end 102, and a frontal view of the second clamp member having a second lever end 108. The first component interface end 102 and the second component interface end 112 (not shown) provide for thermal engagement of either side of the electronic computing component 402. Coupling means 106 provides a bias for the first component interface end 102 and the second component interface end 112 (not shown) toward each other. Wedge 404 is shown to be positioned between the first lever end 104 (not shown) and the second lever end 108 for improved bias of the component interface ends toward the electronic computing component 402. Wedge 404 may be freestanding or may be coupled using a pivotal coupling means to one of the first lever end 104, the second lever end 108, or both.

Figure 6:
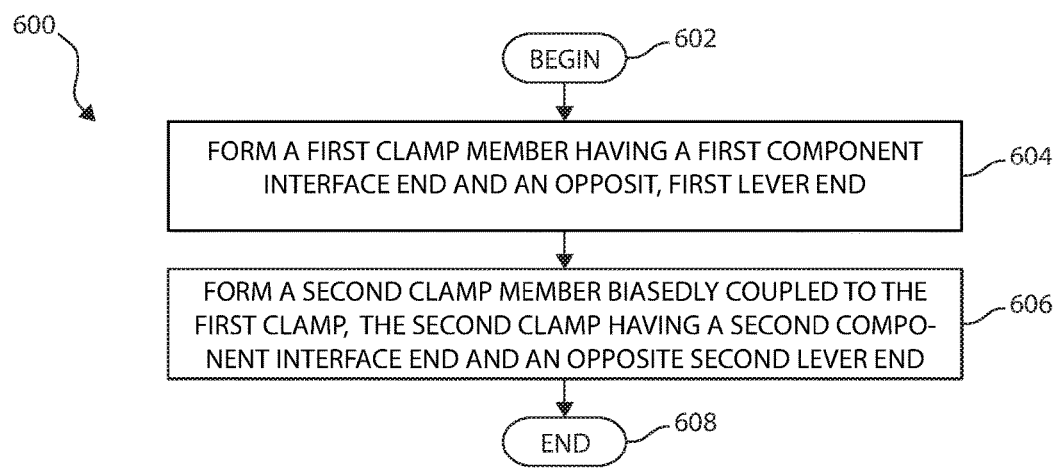
FIG. 6 illustrates a method of manufacturing a heat spreader according to aspects of the present invention.

FIG. 6 illustrates a method of manufacturing a tool-less heat spreader for dissipating heat produced by an electrical computing component 600, according to one embodiment of the present invention. Beginning at step 602, a first clamp member having a first component interface end and an opposite, first lever end is formed (step 604). A second clamp member having a second component interface end and an opposite, second lever end is then formed (step 606). The first clamp member and the second clamp member are biasedly coupled to one another and such movement of at least one of the first lever end and the second lever end at least partially overcomes the bias and moves the first and second component interface ends away from one another. The method ends (step 608).

In the preceding description, various aspects of the present disclosure have been described. For purposes of explanation, specific numbers, systems and configurations were set forth in order to provide a thorough understanding of the present disclosure. However, it is apparent to one skilled in the art having the benefit of this disclosure that the present disclosure may be practiced without the specific details. In other instances, well-known features, components, or modules were omitted, simplified, combined, or split in order not to obscure the present disclosure.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A tool-less heat spreader for dissipating heat produced by an electrical computing component, comprising:
   a first clamp member having a first component interface end and an opposite, first lever end, the first component interface end and the first lever end being of equal height and width;
   a second clamp member having a second component interface end and an opposite, second lever end, the second component interface end and the second lever end being of equal height and width;
   coupling means for pivotally connecting the first clamp member and the second clamp member, the coupling means running an entire width of the first and second clamp members at a horizontal centerline separating the first and second component interface ends and the first and second lever ends such that the first and second component interface ends below the horizontal centerline are of the equal height and width as the first and second lever ends above the horizontal centerline;
   wherein, the first clamp member and the second clamp member are biasedly coupled to one another such that movement of at least one of the first lever end and the second lever end overcomes the bias and moves the first and second component interface ends away from one another;
   a plurality of heat dissipating fins having a series of notched spaces and extensions formed vertically into the first lever end and the second lever end above the horizontal centerline and terminating into the coupling means connecting the first clamp member and the second clamp member such that the first lever end and the second lever end themselves comprise the plurality of heat dissipating fins; and
   a wedge having a width substantially equal to the first and second clamp members, comprised of thermally conductive material and positioned between the first lever end and the second lever end such that, as the wedge is positioned between the first and second lever ends, the first and second component interface ends are further biased toward one another to compress the first and second component interface ends into the electrical computing component.

2. The heat spreader of claim 1, further including a flexible thermal interface material that comprises two substantially planar sections formed into an inside edge of the first component interface end and the second component interface end.

3. The heat spreader of claim 2, wherein the first component interface end and the second component interface end having the flexible thermal interface material are formed such for clasping the electronic computing component when biased toward one another.

4. The heat spreader of claim 1, wherein the coupling means for pivotally connecting the first clamp member and the second clamp member is a spring.

5. The heat spreader of claim 1, wherein the electrical computing component comprises a Dual-Inline Memory Module (DIMM).

6. A tool-less heat spreader for dissipating heat produced by an electrical computing component, comprising:
   a first clamp member having a first component interface end and an opposite, first lever end, the first component interface end and the first lever end being of equal height and width;
   a second clamp member having a second component interface end and an opposite, second lever end, the second component interface end and the second lever end being of equal height and width;
   coupling means for pivotally connecting the first clamp member and the second clamp member, the coupling means running an entire width of the first and second clamp members at a horizontal centerline separating the first and second component interface ends and the first and second lever ends such that the first and second component interface ends below the horizontal centerline are of the equal height and width as the first and second lever ends above the horizontal centerline;
   wherein, the first clamp member and the second clamp member are coupled to one another such that at least one of the first component interface end and the second component interface end is biased toward the other one of the first component interface end and the second component interface end, and such that movement of at least one of the first lever end and the second lever end toward the other of the first lever end and the second lever end overcomes the bias and moves the first and second component interface ends away from one another;

a plurality of heat dissipating fins having a series of notched spaces and extensions formed vertically into the first lever end and the second lever end above the horizontal centerline and terminating into the coupling means connecting the first clamp member and the second clamp member such that the first lever end and the second lever end themselves comprise the plurality of heat dissipating fins; and a wedge having a width substantially equal to the first and second clamp members, comprised of thermally conductive material and positioned between the first lever end and the second lever end such that, as the wedge is positioned between the first and second lever ends, the first and second component interface ends are further biased toward one another to compress the first and second component interface ends into the electrical computing component.

7. The heat spreader of claim 6, further including a flexible thermal interface material that comprises two substantially planar sections formed into an inside edge of the first component interface end and the second component interface end.

8. The heat spreader of claim 7, wherein the first component interface end and the second component interface end having the flexible thermal interface material are formed such for clasping the electronic computing component when biased toward one another.

9. The heat spreader of claim 6, wherein the coupling means for pivotally connecting the first clamp member and the second clamp member is a spring.

10. The heat spreader of claim 6, wherein the electrical computing component comprises a Dual-Inline Memory Module (DIMM).

* * * * *